United States Patent
Kouge et al.

(10) Patent No.: US 11,452,196 B2
(45) Date of Patent: Sep. 20, 2022

(54) EUV CHAMBER APPARATUS, EXTREME ULTRAVIOLET LIGHT GENERATION SYSTEM, AND ELECTRONIC DEVICE MANUFACTURING METHOD

(71) Applicant: Gigaphoton Inc., Tochigi (JP)

(72) Inventors: Kouichiro Kouge, Oyama (JP); Yusuke Hoshino, Oyama (JP); Toshihiro Nishisaka, Oyama (JP); Takashi Okada, Oyama (JP)

(73) Assignee: Gigaphoton Inc., Tochigi (JP)

( * ) Notice: Subject to any disclaimer, the term of this patent is extended or adjusted under 35 U.S.C. 154(b) by 113 days.

(21) Appl. No.: 16/894,504

(22) Filed: Jun. 5, 2020

(65) Prior Publication Data
US 2021/0029811 A1    Jan. 28, 2021

(30) Foreign Application Priority Data
Jul. 25, 2019    (JP) .............................. JP2019-136640

(51) Int. Cl.
H05G 2/00    (2006.01)
G03F 7/20    (2006.01)

(52) U.S. Cl.
CPC ......... H05G 2/006 (2013.01); G03F 7/70025 (2013.01); G03F 7/70033 (2013.01); G03F 7/70041 (2013.01); G03F 7/70808 (2013.01); G03F 7/70858 (2013.01); H05G 2/008 (2013.01)

(58) Field of Classification Search
None
See application file for complete search history.

(56) References Cited

U.S. PATENT DOCUMENTS

| | | | |
|---|---|---|---|
| 2012/0217422 A1* | 8/2012 | Yabu | H05G 2/006 250/504 R |
| 2015/0156855 A1 | 6/2015 | Ershov et al. | |
| 2018/0027642 A1 | 1/2018 | Ershov et al. | |
| 2019/0289705 A1 | 9/2019 | Ishihara et al. | |
| 2020/0033739 A1 | 1/2020 | Hori et al. | |
| 2020/0041909 A1 | 2/2020 | Ueda | |

FOREIGN PATENT DOCUMENTS

| | | | |
|---|---|---|---|
| TW | 202105040 | * | 2/2021 |
| WO | 2018/138918 A1 | | 8/2018 |
| WO | 2018/203369 A1 | | 11/2018 |
| WO | 2018/211569 A1 | | 11/2018 |

OTHER PUBLICATIONS

A Search Report issued by the Netherlands Patent Office dated Nov. 3, 2020, which corresponds to Dutch Patent Application No. 2025606 and is related to U.S. Appl. No. 16/894,504 ; with partial English language explanation.

* cited by examiner

*Primary Examiner* — Michelle M Iacoletti
(74) *Attorney, Agent, or Firm* — Studebaker & Brackett PC

(57) ABSTRACT

An EUV chamber apparatus includes: a chamber; a target generation unit configured to output a target toward a predetermined region inside the chamber; a gas nozzle through which gas is supplied into the chamber; and a shroud including a first flow path through which a first cooling medium circulates and surrounding at least part of the trajectory of the target inside the chamber.

19 Claims, 10 Drawing Sheets

EUV CHAMBER APPARATUS, EXTREME ULTRAVIOLET LIGHT GENERATION SYSTEM, AND ELECTRONIC DEVICE MANUFACTURING METHOD

CROSS-REFERENCE TO RELATED APPLICATIONS

This application claims the benefit of Japanese Patent Application No. 2019-136640, filed on Jul. 25 2019, the entire contents of which are hereby incorporated by reference.

BACKGROUND

1. Technical Field

The present disclosure relates to an EUV chamber apparatus, an extreme ultraviolet light generation system, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 70 nm to 45 nm and further microfabrication at 32 nm or less will be required. To meet the request for microfabrication at 32 nm or less, for example, it is desired to develop an exposure device including an extreme ultraviolet light generation device configured to generate extreme ultraviolet (EUV) light at a wavelength of 13 nm approximately in combination with reduced projection reflective optics.

Disclosed EUV light generation devices include the three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: US Published Patent Application No. 2015/0156855
Patent Document 2: US Published Patent Application No. 2018/0027642
Patent Document 3: International Patent Publication No. 2018/203369

SUMMARY

An EUV chamber apparatus according to an aspect of the present disclosure includes: a chamber; a target generation unit configured to output a target toward a predetermined region inside the chamber; a gas nozzle through which gas is supplied into the chamber; and a shroud including a first flow path through which a first cooling medium circulates and surrounding at least part of the trajectory of the target inside the chamber.

An extreme ultraviolet light generation system according to another aspect of the present disclosure includes: a chamber; a target generation unit configured to output a target toward a predetermined region inside the chamber; a laser apparatus configured to irradiate the target with a pulse laser beam to generate plasma from the target; an EUV light condensing mirror disposed inside the chamber; a gas nozzle through which gas is supplied into the chamber; and a shroud including a first flow path through which a first cooling medium circulates and surrounding at least part of the trajectory of the target inside the chamber.

An electronic device manufacturing method according to another aspect of the present disclosure includes, in an extreme ultraviolet light generation system including a chamber, a target generation unit configured to output a target toward a predetermined region inside the chamber, a laser apparatus configured to irradiate the target with a pulse laser beam to generate plasma from the target, an EUV light condensing mirror disposed inside the chamber, a gas nozzle through which gas is supplied into the chamber, a first flow path through which a first cooling medium circulates, and a shroud surrounding at least part of the trajectory of the target inside the chamber: irradiating the target with the pulse laser beam to generate extreme ultraviolet light; outputting the extreme ultraviolet light to an exposure apparatus; and exposing a photosensitive substrate to the extreme ultraviolet light in the exposure apparatus to manufacture an electronic device.

BRIEF DESCRIPTION OF THE DRAWINGS

Embodiments of the present disclosure will be described below as examples with reference to the accompanying drawings.

DESCRIPTION OF EMBODIMENTS

Figure 1:
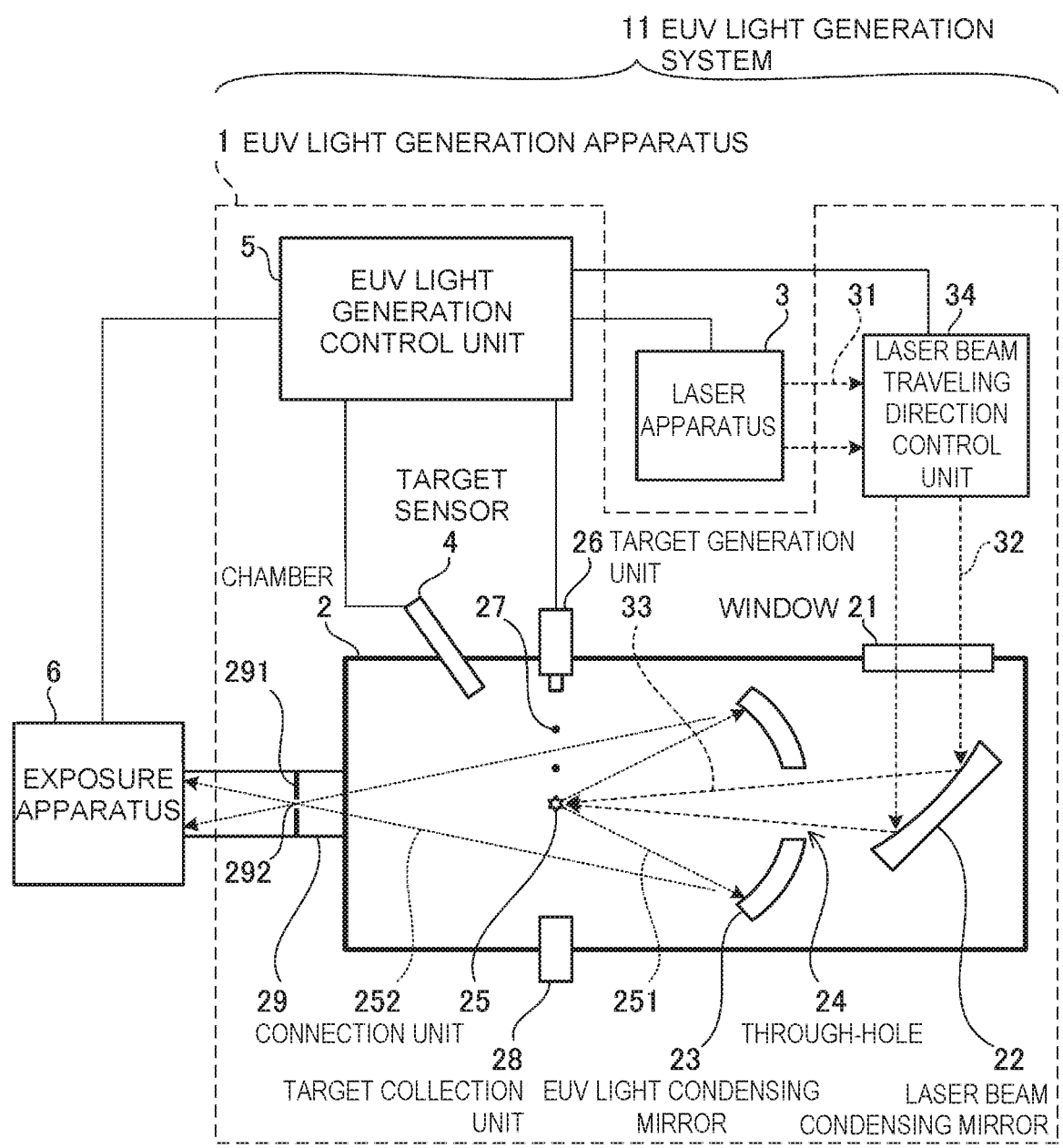
FIG. 1 schematically illustrates the configuration of an exemplary LPP EUV light generation system.

<Contents>
1. Overall description of extreme ultraviolet light generation system
   1.1 Configuration
   1.2 Operation
2. EUV chamber apparatus according to comparative example
   2.1 Configuration
   2.1.1 Chamber
   2.1.2 Laser beam condensing mirror and EUV light condensing mirror
   2.1.3 Target generation unit
   2.1.4 Heat shield
   2.1.5 Hydrogen gas supply unit and exhaust device
   2.1.6 Shroud
   2.2 Operation
   2.3 Problem with comparative example
3. EUV chamber apparatus including cooling mechanism
   3.1 Configuration
   3.1.1 Chamber and heat exchanger
   3.1.2 EUV light condensing mirror and heat exchanger
   3.1.3 Heat shield and heat exchanger
   3.1.4 Shroud and heat exchanger
   3.2 Operation and effect
   3.3 Shroud attachment structure
4. EUV chamber apparatus including cooling-medium temperature adjustment device
   4.1 Configuration
   4.2 Operation
   4.3 Effect
   4.3.1 Cooling of shroud
   4.3.2 Cooling of EUV light condensing mirror
   4.3.3 Cooling of heat shield
5. Shroud having rectangular shape
   5.1 Configuration
   5.2 Operation and effect
6. Shroud having one side opened
   6.1 Configuration
   6.2 Operation and effect
   6.3 Configuration of modification
   6.4 Operation and effect of modification
7. Shroud having cylindrical shape
   7.1 Configuration
   7.2 Operation and effect
8. Other Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overall Description of Extreme Ultraviolet Light Generation System 1.1 Configuration FIG. 1 schematically illustrates the configuration of an exemplary LPP EUV light generation system 11. An EUV light generation apparatus 1 is used together with at least one laser apparatus 3. In the present application, a system including the EUV light generation apparatus 1 and the laser apparatus 3 is referred to as the EUV light generation system 11. As illustrated in FIG. 1 and described below in detail, the EUV light generation apparatus 1 includes a chamber 2 and a target generation unit 26. The chamber 2 is configured to be sealable. The target generation unit 26 is attached, for example, to penetrate through the wall of the chamber 2. The material of a target substance output from the target generation unit 26 contains tin. The material of the target substance may contain tin in combination with terbium, gadolinium, lithium, or xenon.

The wall of the chamber 2 is provided with at least one through-hole. A window 21 is provided to the through-hole. A pulse laser beam 32 output from the laser apparatus 3 transmits through the window 21. The chamber 2 includes, for example, an EUV light condensing mirror 23 having a spheroidal reflective surface. The EUV light condensing mirror 23 has first and second focal points. For example, a multi-layer reflective film obtained by alternately stacking molybdenum and silicon is formed on the surface of the EUV light condensing mirror 23. The EUV light condensing mirror 23 is disposed so that, for example, the first focal point is positioned in a plasma generation region 25 and the second focal point is positioned at an intermediate focus point (IF) 292. A through-hole 24 is provided at a central part of the EUV light condensing mirror 23. A pulse laser beam 33 passes through the through-hole 24.

The EUV light generation apparatus 1 includes an EUV light generation control unit 5, a target sensor 4, and the like. The target sensor 4 has an image capturing function to detect the existence, trajectory, position, speed, and the like of a target 27.

The EUV light generation apparatus 1 also includes a connection unit 29 that provides communication between the inside of the chamber 2 and the inside of an exposure apparatus 6. A wall 291 through which an aperture is formed is provided inside the connection unit 29. The wall 291 is disposed so that the aperture is positioned at the second focal point of the EUV light condensing mirror 23.

The EUV light generation apparatus 1 also includes a laser beam traveling direction control unit 34, a laser beam condensing mirror 22, a target collection unit 28 for collecting the target 27, and the like. The laser beam traveling direction control unit 34 includes an optical element for defining the traveling direction of a laser beam, and an actuator for adjusting the position, posture, and the like of the optical element.

1.2 Operation

As illustrated in FIG. 1, a pulse laser beam 31 output from the laser apparatus 3 passes through the laser beam traveling direction control unit 34, transmits through the window 21 as the pulse laser beam 32, and is incident in the chamber 2. The pulse laser beam 32 travels along at least one laser beam path in the chamber 2 and is reflected by the laser beam condensing mirror 22 and incident on the at least one target 27 as the pulse laser beam 33.

The target generation unit 26 outputs the target 27 toward the plasma generation region 25 inside the chamber 2. The target 27 is irradiated with at least one pulse included in the pulse laser beam 33. Plasma is generated from the target 27 being irradiated with the pulse laser beam and radiates radiation light 251. The EUV light condensing mirror 23 reflects EUV light included in the radiation light 251 at a reflectance higher than that of light in other wavelength bands. Reflected light 252 including the EUV light reflected by the EUV light condensing mirror 23 is condensed at the intermediate focus point 292 and output to the exposure apparatus 6. One target 27 may be irradiated with a plurality of pulses included in the pulse laser beam 33.

The EUV light generation control unit 5 collectively controls the entire EUV light generation system 11. The EUV light generation control unit 5 processes, for example, image data of the target 27 captured by the target sensor 4. In addition, the EUV light generation control unit 5 controls, for example, the output timing of the target 27, the output direction of the target 27, and the like. The EUV light generation control unit 5 also controls, for example, the oscillation timing of the laser apparatus 3, the traveling direction of the pulse laser beam 32, the focusing position of the pulse laser beam 33, and the like. These various kinds of control are merely exemplary, and may include other control as necessary.

Figure 2:
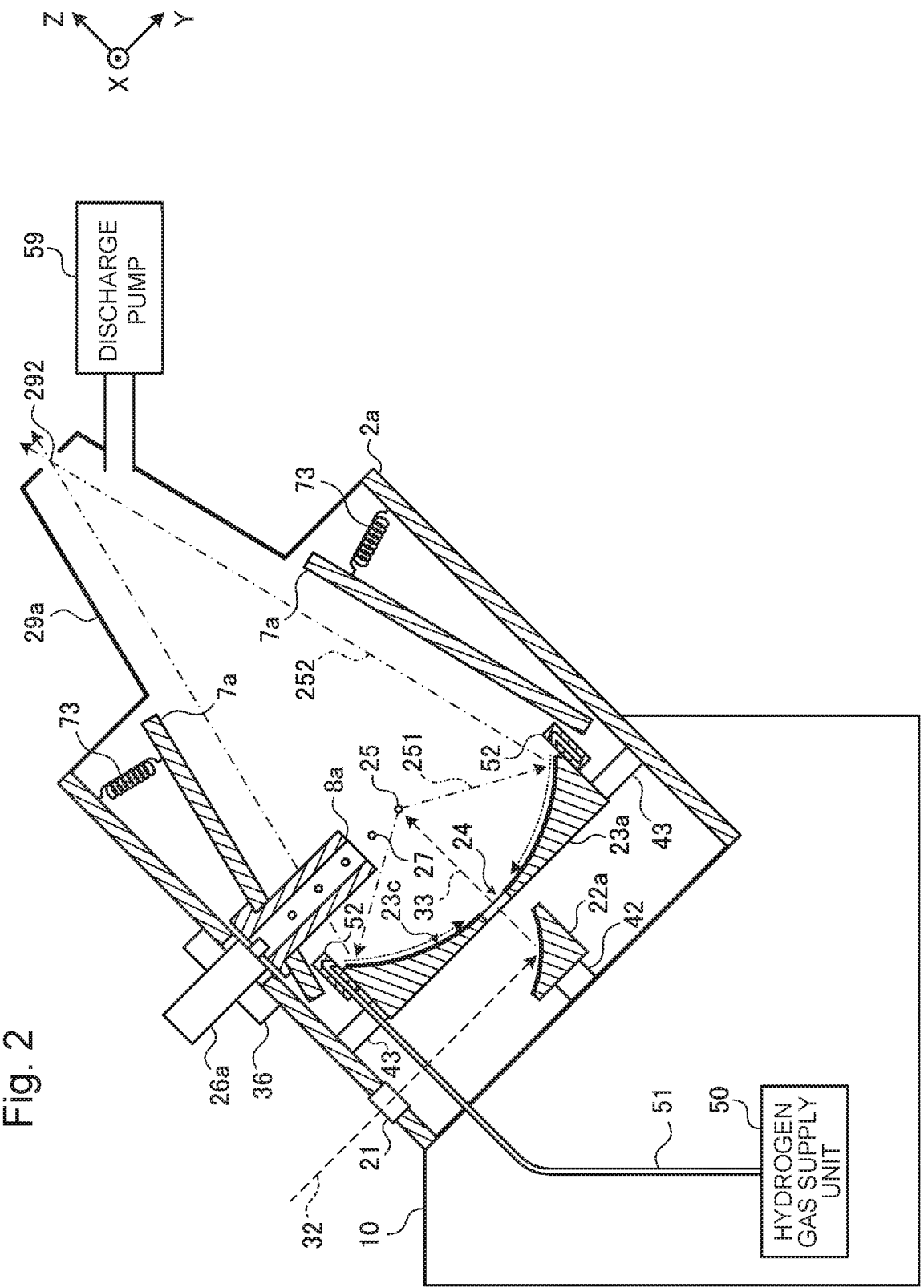
FIG. 2 schematically illustrates the configuration of an EUV chamber apparatus according to a comparative example.

2. EUV Chamber Apparatus according to Comparative Example 2.1 Configuration 2.1.1 Chamber FIG. 2 schematically illustrates the configuration of an EUV chamber apparatus according to a comparative example. In the present disclosure, an EUV chamber device includes a chamber 2a, a component inside the chamber 2a, and a component around the chamber 2a. In FIG. 2, the EUV chamber apparatus includes a target generation unit 26a and a gas nozzle 52. The EUV chamber apparatus may include a component other than these components.

As illustrated in FIG. 2, the chamber 2a is held in a posture oblique to the gravity direction by a chamber holder 10. In the following description, the output direction of the EUV light is defined as a positive Z direction. The output direction of the target 27 is defined as a positive Y direction. A direction orthogonal to the positive Z direction and the positive Y direction is defined as an X direction.

A laser beam condensing mirror 22a, an EUV light condensing mirror 23a, a heat shield 7a, and a shroud 8a are provided inside the chamber 2a. A hydrogen gas supply unit 50, a discharge pump 59, the target generation unit 26a, and a connection unit 29a are attached outside the chamber 2a.

2.1.2 Laser Beam Condensing Mirror and EUV Light Condensing Mirror

The laser beam condensing mirror 22a is supported inside the chamber 2a by a holder 42. The laser beam condensing mirror 22a is configured as an off-axis parabolic mirror. The off-axis parabolic mirror has a focal point positioned in the plasma generation region 25. The plasma generation region 25 corresponds to a predetermined region in the present disclosure.

The EUV light condensing mirror 23a is supported inside the chamber 2a by an EUV light condensing mirror holder 43.

2.1.3 Target Generation Unit

The target generation unit 26a is attached to the chamber 2a through a stage 36. The stage 36 moves the target generation unit 26a in the X and Z directions to adjust the trajectory of the target 27.

2.1.4 Heat Shield

The heat shield 7a is disposed inside the chamber 2a, surrounding the optical path of the reflected light 252 including the EUV light reflected by the EUV light condensing mirror 23a. In other words, the heat shield 7a is positioned between the plasma generation region 25 and the chamber 2a. The heat shield 7a has a tapered tubular shape having a diameter that is larger on the negative Z direction side and smaller on the positive Z direction side. Part of the heat shield 7a on the large-diameter side is positioned near an outer peripheral part of the EUV light condensing mirror 23a. Part of the heat shield 7a on the small-diameter side is positioned downstream on the optical path of the reflected light 252 including the EUV light reflected by the EUV light condensing mirror 23a.

The heat shield 7a and the chamber 2a are connected with each other through a plurality of elastic members 73.

2.1.5 Hydrogen Gas Supply Unit and Exhaust Device

The hydrogen gas supply unit 50 includes a tank (not illustrated) in which hydrogen gas is housed, and a mass flow controller or an on-off valve (not illustrated). The hydrogen gas supply unit 50 is connected with at least one hydrogen gas supply tube 51. The hydrogen gas supply tube 51 penetrates through the chamber 2a and is connected with the gas nozzle 52. The gas nozzle 52 is disposed in an annular shape along the outer periphery of the EUV light condensing mirror 23a.

The discharge pump 59 is connected with the inside of the chamber 2a or the connection unit 29a. A fine particle trap and a detoxification device (both not illustrated) may be disposed between the discharge pump 59 and the chamber 2a or the connection unit 29a.

2.1.6 Shroud

The shroud 8a is a member disposed to surround at least part of the trajectory of the target 27 from the target generation unit 26a to the plasma generation region 25 inside the chamber 2a. The shroud 8a is fixed to the heat shield 7a.

2.2 Operation

The target generation unit 26a outputs the target 27 toward the plasma generation region 25 inside the chamber 2a. The target 27 passes through the inside of the shroud 8a and reaches the plasma generation region 25. Since the shroud 8a surrounds at least part of the trajectory of the target 27, the position of the target 27 is prevented from deviating from an ideal trajectory due to gas flow inside the chamber 2a.

The pulse laser beam 32 is incident on the laser beam condensing mirror 22a in the chamber 2a through the window 21. Having been reflected by the laser beam condensing mirror 22a, the pulse laser beam 33 is condensed in the plasma generation region 25. The pulse laser beam 33 reaches the plasma generation region 25 at a timing when the target 27 reaches the plasma generation region 25. Plasma is generated from the target 27 being irradiated with the pulse laser beam 33. The plasma radiates the radiation light 251 including EUV light.

Tin debris is also generated from the plasma. Adhesion of the tin debris to a reflective surface 23c of the EUV light condensing mirror 23a decreases the reflectance of the reflective surface 23c. To avoid this, the hydrogen gas supply unit 50 supplies gas containing hydrogen gas into the chamber 2a through the gas nozzle 52. The gas nozzle 52 causes the hydrogen gas to flow along the reflective surface 23c of the EUV light condensing mirror 23a inward from the vicinity of the EUV light condensing mirror 23a. Accordingly, tin is prevented from reaching the reflective surface 23c. In addition, tin adhering to the reflective surface 23c is etched. Specifically, the hydrogen gas is excited into hydrogen radical by the EUV light or the like and becomes stannane gas at room temperature through reaction with tin.

The discharge pump 59 performs discharging so that the pressure inside the chamber 2a becomes equal to a predetermined pressure lower than atmospheric pressure. Accordingly, the hydrogen gas output from the gas nozzle 52 and the stannane gas generated through reaction between the hydrogen radical and tin are discharged.

2.3 Problem with the Comparative Example

The stannane gas generated through reaction between the hydrogen radical and tin is not always immediately discharged by the discharge pump 59, but part of the generated stannane gas remains inside the chamber 2a for a while in some cases. Inside the chamber 2a, stannane dissociates into hydrogen gas and tin, and the tin is deposited on the surface of a component inside the chamber 2a in some cases. In particular, the dissociation speed of stannane is faster near a component at high temperature.

The tin deposition does not uniformly occur on the surface of a component inside the chamber 2a, but a clump of the deposited tin grows at a particular place in some cases. As the clump of deposited tin becomes larger, the clump eventually obstructs part of the optical path of the reflected light 252 in some cases. In addition, the clump of deposited tin that has been grown flaks and falls on the reflective surface 23c of the EUV light condensing mirror 23a, which potentially decreases the reflectance of the EUV light condensing mirror 23a. In addition, the deposited tin that has been grown is potentially heated to a temperature higher than the melting point of tin and drops on the reflective surface 23c of the EUV light condensing mirror 23a.

In particular, the shroud 8a surrounding the trajectory of the target 27 is likely to be heated to high temperature when positioned near the plasma generation region 25. In addition, when the EUV light condensing mirror 23a is positioned below the shroud 8a in the gravity direction, the deposited tin potentially falls from the surface of the shroud 8a and decreases the reflectance of the EUV light condensing mirror 23a.

In an embodiment described below, the shroud 8a includes a flow path 8b of a cooling medium to prevent increase of the temperature of the shroud 8a and prevent tin deposition.

3. EUV Chamber Apparatus including Cooling Mechanism 3.1 Configuration

Figure 3:
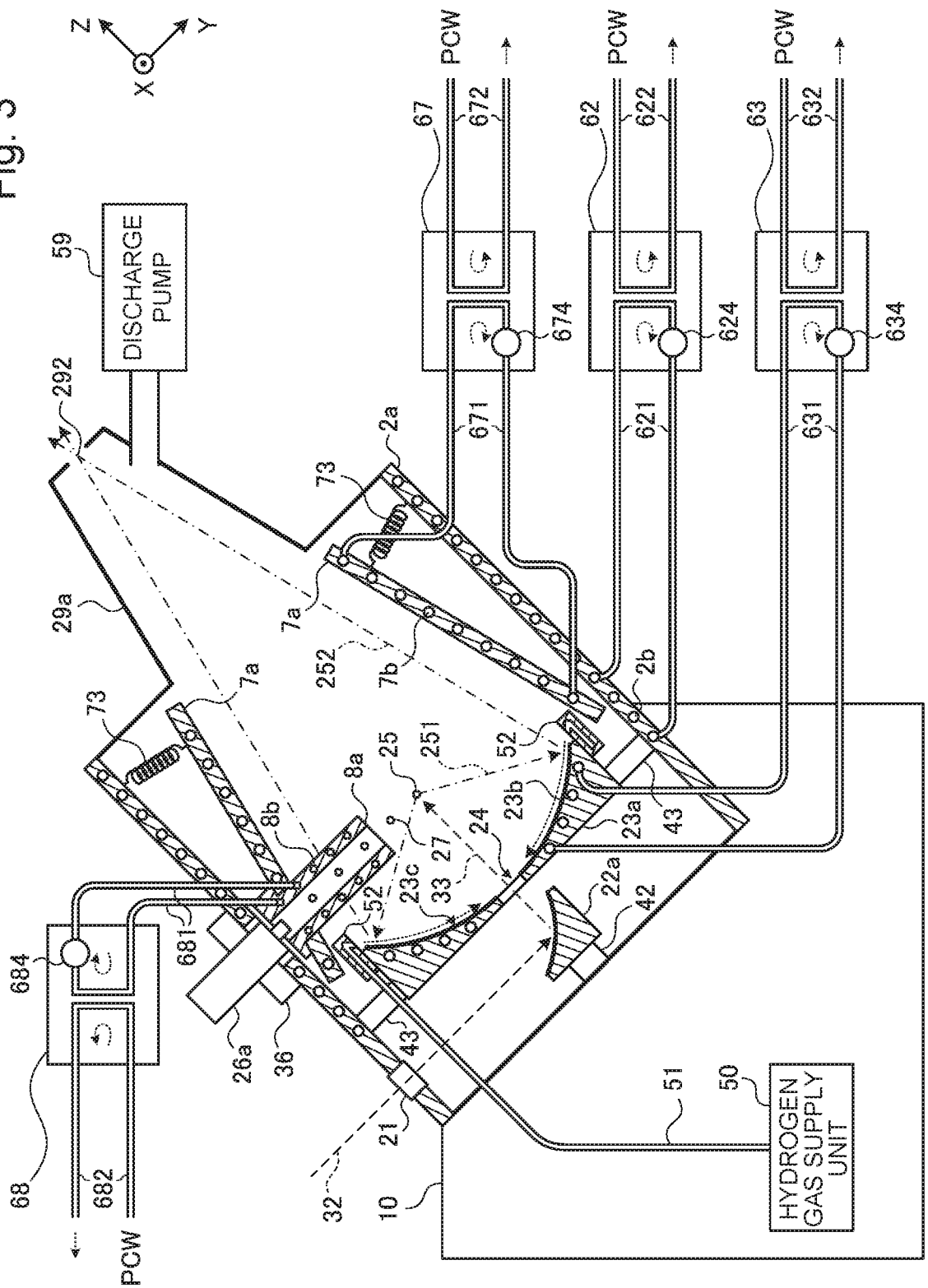
FIG. 3 schematically illustrates the configuration of an EUV chamber apparatus according to a first embodiment of the present disclosure.

FIG. 3 schematically illustrates the configuration of an EUV chamber apparatus according to a first embodiment of the present disclosure. In the first embodiment, some components of the EUV chamber apparatus include a flow path through which a cooling medium circulates. A plurality of heat exchangers 62, 63, 67, and 68 are provided outside the chamber 2a.

3.1.1 Chamber and Heat Exchanger

The chamber 2a includes a flow path 2b through which a chamber cooling medium circulates. The chamber cooling medium is, for example, water. The flow path 2b is connected with the heat exchanger 62 through a cooling medium pipe 621. The chamber cooling medium corresponds to a second cooling medium in the present disclosure. The flow path 2b corresponds to a second flow path in the present disclosure.

The heat exchanger 62 includes part of the cooling medium pipe 621, part of a process cooling water pipe 622, and a circulation pump 624.

The cooling medium pipe 621 has one end connected with the exit of the flow path 2b and has the other end connected with the entrance of the flow path 2b. The heat exchanger 62 is positioned halfway through the cooling medium pipe 621. The circulation pump 624 is disposed at the cooling medium pipe 621.

The process cooling water pipe 622 is included in the flow path of process cooling water (PCW) supplied from the outside of the apparatus. The process cooling water has a substantially constant temperature, and the temperature is, for example, 10° C. to 14° C. inclusive. The cooling medium pipe 621 and the process cooling water pipe 622 are disposed close to each other so that heat conduction is efficiently performed inside the heat exchanger 62.

3.1.2 EUV Light Condensing Mirror and Heat Exchanger

The EUV light condensing mirror 23a includes a flow path 23b through which a condensing mirror cooling medium circulates. The condensing mirror cooling medium is, for example, water. The flow path 23b is connected with the heat exchanger 63 through a cooling medium pipe 631. The condensing mirror cooling medium corresponds to a third cooling medium in the present disclosure. The flow path 23b corresponds to a third flow path in the present disclosure.

The heat exchanger 63 includes part of the cooling medium pipe 631, part of a process cooling water pipe 632, and a circulation pump 634.

The cooling medium pipe 631 has one end connected with the exit of the flow path 23b and has the other end connected with the entrance of the flow path 23b. The heat exchanger 63 is positioned halfway through the cooling medium pipe 631. The circulation pump 634 is disposed at the cooling medium pipe 631.

The process cooling water pipe 632 is included in the flow path of the process cooling water supplied from the outside of the apparatus. The cooling medium pipe 631 and the process cooling water pipe 632 are disposed close to each other so that heat conduction is efficiently performed inside the heat exchanger 63.

3.1.3 Heat Shield and Heat Exchanger

The heat shield 7a includes a flow path 7b through which a heat shield cooling medium circulates. The heat shield cooling medium is, for example, water. The flow path 7b is connected with the heat exchanger 67 through a cooling medium pipe 671. The heat shield cooling medium corresponds to a fourth cooling medium in the present disclosure. The flow path 7b corresponds to a fourth flow path in the present disclosure.

The heat exchanger 67 includes part of the cooling medium pipe 671, part of a process cooling water pipe 672, and a circulation pump 674.

The cooling medium pipe 671 has one end connected with the exit of the flow path 7b and has the other end connected with the entrance of the flow path 7b. The heat exchanger 67 is positioned halfway through the cooling medium pipe 671. The circulation pump 674 is disposed at the cooling medium pipe 671.

The process cooling water pipe 672 is included in the flow path of the process cooling water supplied from the outside of the apparatus. The cooling medium pipe 671 and the process cooling water pipe 672 are disposed close to each other so that heat conduction is efficiently performed inside the heat exchanger 67.

3.1.4 Shroud and Heat Exchanger

The shroud 8a includes the flow path 8b through which a shroud cooling medium circulates. The shroud cooling medium is, for example, water. The flow path 8b is connected with the heat exchanger 68 through a cooling medium pipe 681. The shroud cooling medium corresponds to a first cooling medium in the present disclosure. The flow path 8b corresponds to a first flow path in the present disclosure.

The heat exchanger 68 includes part of the cooling medium pipe 681, part of a process cooling water pipe 682, and a circulation pump 684.

The cooling medium pipe 681 has one end connected with the exit of the flow path 8b and has the other end connected with the entrance of the flow path 8b. The heat exchanger 68 is positioned halfway through the cooling medium pipe 681. The circulation pump 684 is disposed at the cooling medium pipe 681.

The process cooling water pipe 682 is included in the flow path of the process cooling water supplied from the outside of the apparatus. The cooling medium pipe 681 and the process cooling water pipe 682 are disposed close to each other so that heat conduction is efficiently performed inside the heat exchanger 68.

As for the other features, the configuration of the first embodiment is same as the configuration of the comparative example.

3.2 Operation and Effect

The chamber cooling medium receives thermal energy from the chamber 2a and is discharged from the flow path 2b. Having been discharged from the flow path 2b, the chamber cooling medium at high temperature is cooled to a temperature equivalent to or slightly higher than the temperature of the process cooling water by the heat exchanger 62. For example, the chamber cooling medium is cooled to a temperature of 12° C. to 16° C. inclusive. The cooled chamber cooling medium is returned to the flow path 2b.

Accordingly, the temperature of the chamber 2a is prevented from increasing, and the chamber 2a is prevented from deforming. In addition, tin deposition on the inner surface of the chamber 2a is prevented.

The condensing mirror cooling medium receives thermal energy from the EUV light condensing mirror 23a and is discharged from the flow path 23b. Having been discharged from the flow path 23b, the condensing mirror cooling medium at high temperature is cooled to a temperature equivalent to or slightly higher than the temperature of the process cooling water by the heat exchanger 63. For example, the condensing mirror cooling medium is cooled to a temperature of 12° C. to 16° C. inclusive. The cooled condensing mirror cooling medium is returned to the flow path 23b.

Accordingly, the temperature of the EUV light condensing mirror 23a is prevented from increasing, and the EUV light condensing mirror 23a is prevented from deforming. In addition, tin deposition on the surface of the EUV light condensing mirror 23a is prevented.

The heat shield cooling medium receives thermal energy from the heat shield 7a and is discharged from the flow path 7b. Having been discharged from the flow path 7b, the heat shield cooling medium at high temperature is cooled to a temperature equivalent to or slightly higher than the temperature of the process cooling water by the heat exchanger 67. For example, the heat shield cooling medium is cooled to a temperature of 12° C. to 16° C. inclusive. The cooled heat shield cooling medium is returned to the flow path 7b.

Accordingly, the temperature of the heat shield 7a is prevented from increasing, and the temperature of the chamber 2a, which is separated from the plasma generation region 25 at high temperature through the heat shield 7a, is prevented from increasing. In addition, tin deposition on the surface of the heat shield 7a is prevented.

The shroud cooling medium receives thermal energy from the shroud 8a and is discharged from the flow path 8b. Having been discharged from the flow path 8b, the shroud cooling medium at high temperature is cooled to a temperature equivalent to or slightly higher than the temperature of the process cooling water by the heat exchanger 68. For example, the shroud cooling medium is cooled to a temperature of 12° C. to 16° C. inclusive. The cooled shroud cooling medium is returned to the flow path 8b.

Accordingly, the temperature of the shroud 8a is prevented from increasing, and tin deposition on the surface of the shroud 8a is prevented.

Thus, the probability of decrease of the reflectance of the EUV light condensing mirror 23a can be reduced.

As for the other features, the operation and effect of the first embodiment are same as the operation and effect of the comparative example.

3.3 Shroud Attachment Structure

Figure 4A:
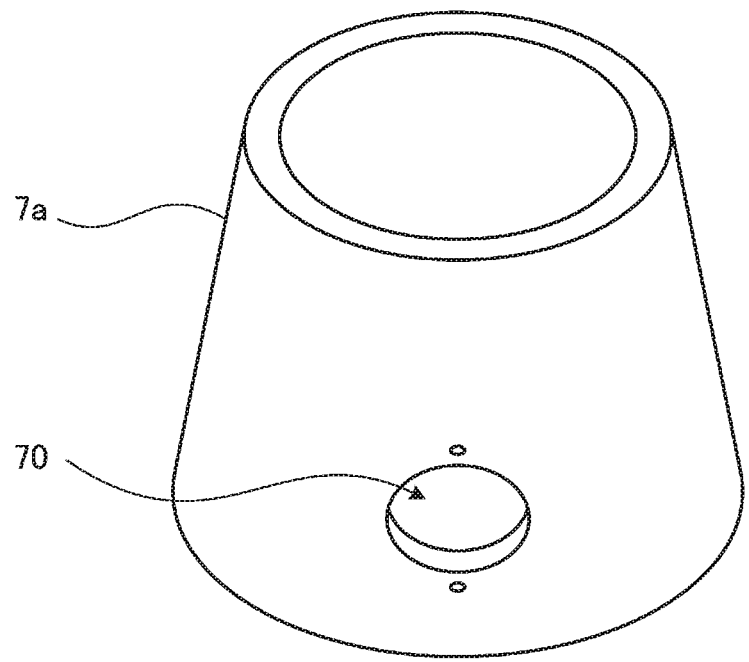
FIG. 4A is a perspective view of a heat shield in the first embodiment.
Figure 4B:
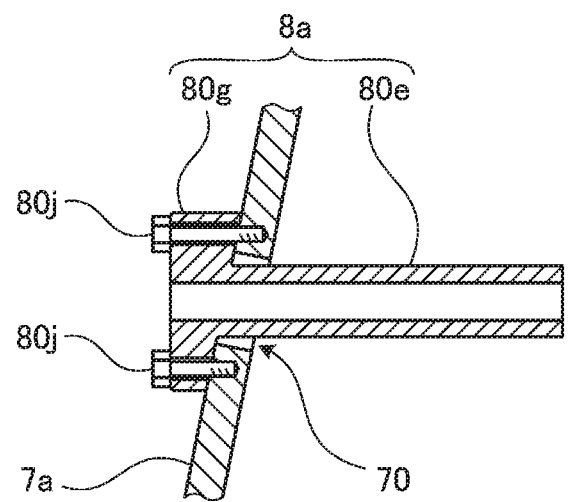
FIG. 4B is a cross-sectional view illustrating a structure in which a shroud is attached to the heat shield in the first embodiment.

FIG. 4A is a perspective view of the heat shield 7a in the first embodiment. FIG. 4B is a cross-sectional view illustrating a structure in which the shroud 8a is attached to the heat shield 7a in the first embodiment. The shroud 8a includes a body part 80e and a flange part 80g. In FIG. 4B, illustration of the flow path of the shroud cooling medium is omitted.

The heat shield 7a has a tapered tubular shape. The heat shield 7a includes a through-hole 70. The body part 80e of the shroud 8a penetrates through the through-hole 70 inward from the outside of the heat shield 7a. The flange part 80g of the shroud 8a is positioned outside the heat shield 7a. The flange part 80g is fixed to the outer surface of the heat shield 7a by a bolt 80j. At least part of the body part 80e is positioned inside the heat shield 7a.

Since the shroud 8a is fixed from the outside of the heat shield 7a in this manner, maintenance such as replacement of the shroud 8a can be easily performed.

Figure 5:
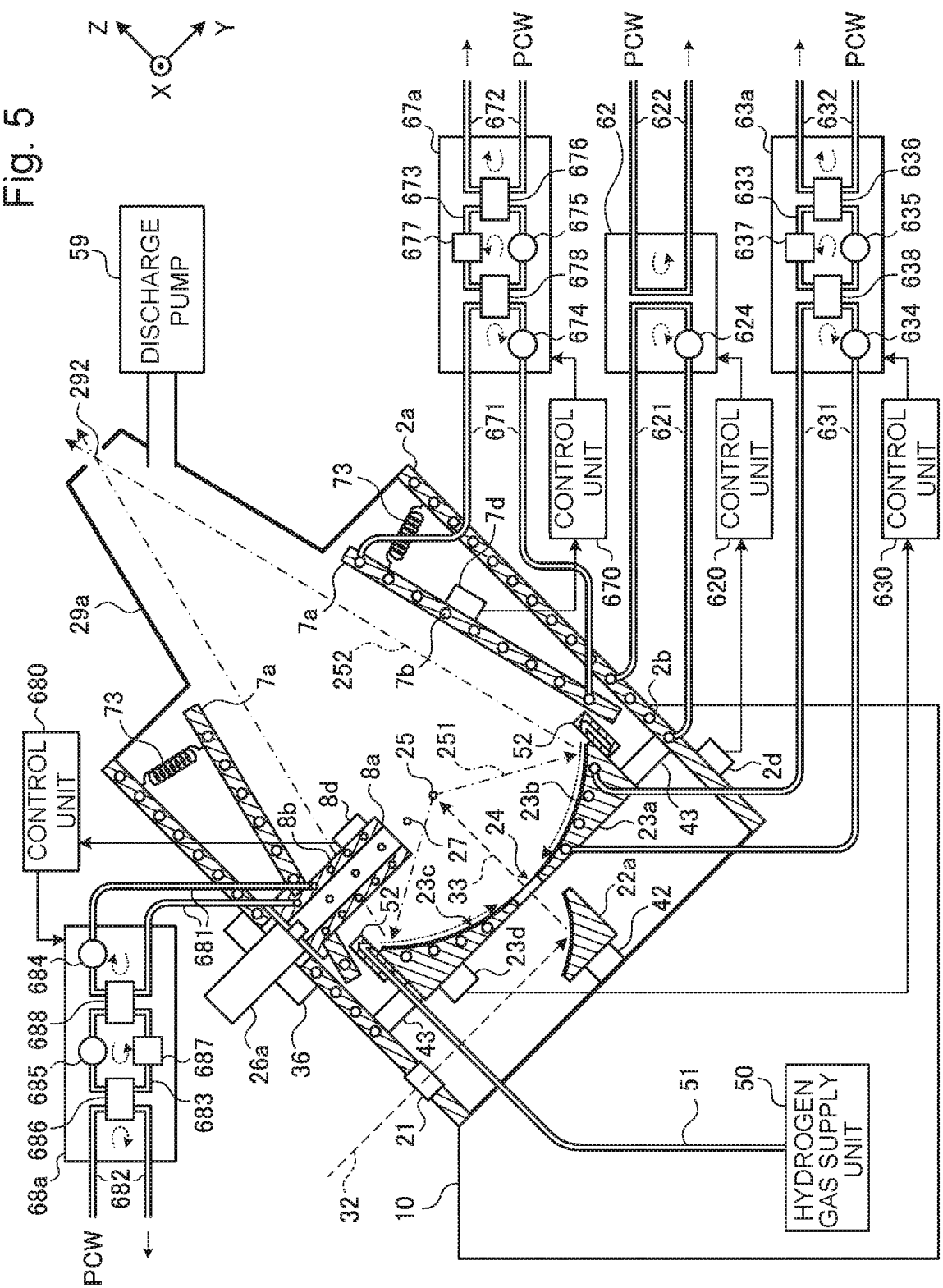
FIG. 5 schematically illustrates the configuration of an EUV chamber apparatus according to a second embodiment of the present disclosure.

4. EUV Chamber Apparatus including Cooling-Medium Temperature Adjustment Device 4.1 Configuration FIG. 5 schematically illustrates the configuration of an EUV chamber apparatus according to a second embodiment of the present disclosure. In the second embodiment, the EUV chamber apparatus includes a chiller 68a in place of the heat exchanger 68 described with reference to FIG. 3. The chiller 68a corresponds to a first temperature adjustment device in the present disclosure, and adjusts the temperature of the shroud cooling medium. In addition, the EUV chamber apparatus includes a temperature sensor 8d and a control unit 680.

The EUV chamber apparatus may include chillers 63a and 67a in place of the heat exchangers 63 and 67 described with reference to FIG. 3. In addition, the EUV chamber apparatus may include temperature sensors 2d, 7d, and 23d and control units 620, 630, and 670.

The chiller 68a includes a refrigerant pipe 683 having an annular shape. A compressor 685, a condenser 686, an expansion valve 687, and an evaporator 688 are disposed in the stated order at the refrigerant pipe 683. For example, a material that stores a large amount of latent heat at evaporation is selected as refrigerant filling the refrigerant pipe 683.

The compressor 685 compresses and feeds the refrigerant from the evaporator 688 side to the condenser 686 side. In the condenser 686, the refrigerant pipe 683 and the process cooling water pipe 682 are disposed close to each other. The expansion valve 687 is a throttle valve configured to restrict flow of the refrigerant from the condenser 686 side at high pressure to the evaporator 688 side at low pressure. In the evaporator 688, the refrigerant pipe 683 and the cooling medium pipe 681 are disposed close to each other.

The configuration of the chiller 63a is same as the configuration of the chiller 68a. Each component of the chiller 63a is denoted by a reference sign starting with "63". The chiller 63a corresponds to a second temperature adjustment device in the present disclosure.

The configuration of the chiller 67a is same as the configuration of the chiller 68a. Each component of the chiller 67a is denoted by a reference sign starting with "67". The chiller 67a corresponds to a third temperature adjustment device in the present disclosure.

The temperature sensor 8d is configured as, for example, a thermocouple. The temperature sensor 8d measures the temperature of the shroud 8a and outputs a result of the measurement. The temperature sensor 8d may be disposed inside the shroud 8a. The temperature sensor 8d may include a plurality of sensors provided at a plurality of positions on the shroud 8a. The temperature of the shroud 8a may be an average of temperatures measured by the sensors or may be the highest one of the temperatures measured by the sensors.

The control unit 680 controls the chiller 68a based on the temperature of the shroud 8a output from the temperature sensor 8d. The control of the chiller 68a includes, for example, control of any one or both of the expansion valve 687 and the circulation pump 684. Through the control of the expansion valve 687, the temperature of the shroud cooling medium supplied to the flow path 8b is controlled. Through the control of the circulation pump 684, the flow rate of the shroud cooling medium is controlled.

When the temperature of the shroud 8a is higher than a predetermined upper limit temperature, the control unit 680 decreases the temperature of the shroud cooling medium supplied to the flow path 8b or increases the flow rate of the shroud cooling medium. When the temperature of the shroud 8a is lower than a predetermined lower limit temperature, the control unit 680 increases the temperature of the shroud cooling medium supplied to the flow path 8b or decreases the flow rate of the shroud cooling medium.

The configurations of the temperature sensors 2d, 7d, and 23d and the control units 620, 630, and 670 are same as the configurations of the temperature sensor 8d and the control unit 680, respectively. The control unit 620 controls the circulation pump 624 of the heat exchanger 62.

As for the other features, the configuration of the second embodiment is same as the configuration of the first embodiment.

4.2 Operation

In the chiller 68a, the refrigerant compressed into high-temperature and high-pressure gas by the compressor 685 releases heat through condensation in the condenser 686. Part of this thermal energy is provided to the process cooling water. As the refrigerant having become room-temperature and high-pressure liquid through the condenser 686 is ejected from the expansion valve 687 toward the evaporator 688, the pressure thereof decreases and the refrigerant becomes low-temperature and low-pressure liquid. In the evaporator 688, the refrigerant absorbs heat through evaporation and stores thermal energy as latent heat. Part of this thermal energy is provided from the shroud cooling medium. The refrigerant becomes low-temperature and low-pressure gas and is returned to the compressor 685.

In this manner, the chiller 68a can cool the shroud cooling medium to a temperature lower than the temperature of the process cooling water. The temperature of the shroud cooling medium supplied to the flow path 8b may be, for example, 0° C. or lower. The cooled shroud cooling medium is returned to the flow path 8b and cools the shroud 8a.

The operation of the chiller 63a and the chiller 67a is same as the operation of the chiller 68a. However, the chiller 63a cools the condensing mirror cooling medium, and the chiller 67a cools the heat shield cooling medium.

4.3 Effect 4.3.1 Cooling of Shroud

According to the second embodiment, the shroud 8a can be cooled so that the stannane dissociation can be prevented at the shroud 8a by cooling the shroud cooling medium to a temperature lower than the temperature of the process cooling water. Thus, tin deposition on the surface of the shroud 8a can be prevented.

When the surface temperature of a component in the chamber is 5° C. or lower, the speed of tin etching by the hydrogen radical is higher than the speed of tin deposition on the component in the chamber since the dissociation speed of the stannane gas is low.

When the surface temperature of the component in the chamber exceeds 5° C., up to 40° C. approximately, the speed of tin etching by the hydrogen radical can be expected to be equivalent to the speed of tin deposition on the component in the chamber.

When the surface temperature of the component in the chamber exceeds 40° C., the speed of tin deposition on the component in the chamber is higher than the speed of tin etching by the hydrogen radical.

Thus, the temperature of the shroud 8a is preferably lower than 40° C.

The temperature of the shroud 8a is more preferably lower than 5° C.

Similarly to the first embodiment, increase of the temperature of the chamber 2a is prevented by using the heat exchanger 62. When the chamber cooling medium is cooled to a temperature equal to the temperature of the shroud cooling medium, the chamber 2a is potentially cooled than needed. For example, dew condensation of steam in air potentially occurs on the surface of the chamber 2a. The dew condensation at the chamber 2a potentially hinders operation of the EUV light generation apparatus.

Thus, the chiller 68a is desirably controlled so that the temperature of the shroud 8a becomes lower than the temperature of the chamber 2a. For example, when the shroud 8a is maintained at 5° C. or lower, the chamber 2a is desirably maintained at 15° C. to 25° C. inclusive.

In addition, the chiller 68a is desirably controlled so that the temperature of the shroud cooling medium supplied to the flow path 8b becomes lower than the temperature of the chamber cooling medium supplied to the flow path 2b.

4.3.2 Cooling of EUV Light Condensing Mirror

According to the second embodiment, tin deposition on the EUV light condensing mirror 23a can be prevented by cooling the condensing mirror cooling medium to a temperature lower than the temperature of the process cooling water.

In addition, the chillers 68a and 63a are desirably controlled so that the temperature of the shroud 8a and the temperature of the EUV light condensing mirror 23a become lower than the temperature of the chamber 2a. For example, when the shroud 8a and the EUV light condensing mirror 23a are maintained at 5° C. or lower, the chamber 2a is desirably maintained at 15° C. to 25° C. inclusive.

In addition, the chillers 68a and 63a are desirably controlled so that the temperature of the shroud cooling medium supplied to the flow path 8b and the temperature of the condensing mirror cooling medium supplied to the flow path 23b become lower than the temperature of the chamber cooling medium supplied to the chamber 2a.

4.3.3 Cooling of Heat Shield

According to the second embodiment, tin deposition on the heat shield 7a can be prevented by cooling the heat shield cooling medium to a temperature lower than the temperature of the process cooling water.

In addition, the chillers 68a and 67a are desirably controlled so that the temperature of the shroud 8a and the temperature of the heat shield 7a become lower than the temperature of the chamber 2a. For example, when the shroud 8a and the heat shield 7a are maintained at 5° C. or lower, the chamber 2a is desirably maintained at 15° C. to 25° C. inclusive.

In addition, the chillers 68a and 67a are desirably controlled so that the temperature of the shroud cooling medium supplied to the flow path 8b and the temperature of the heat shield cooling medium supplied to the flow path 7b become lower than the temperature of the chamber cooling medium supplied to the chamber 2a.

In the second embodiment, the shroud cooling medium and the heat shield cooling medium are separated cooling systems, but the present disclosure is not limited thereto. The flow path 7b may be positioned upstream of the flow path 8b. Accordingly, the cooling medium having passed through the flow path 7b may flow into the flow path 8b and thereafter be cooled by a common chiller and supplied to the flow path 7b again.

The temperature of each component in the chamber 2a potentially varies due to an EUV light output condition and the like. According to the second embodiment, a chiller or a heat exchanger can be controlled based on the actual value of the temperature of the component in the chamber 2a to adjust the temperature of the component in the chamber 2a to a temperature in a desired range.

As for the other features, the operation and effect of the second embodiment are same as the operation and effect of the first embodiment.

5. Shroud having Rectangular Shape

5.1 Configuration

Figure 6A:
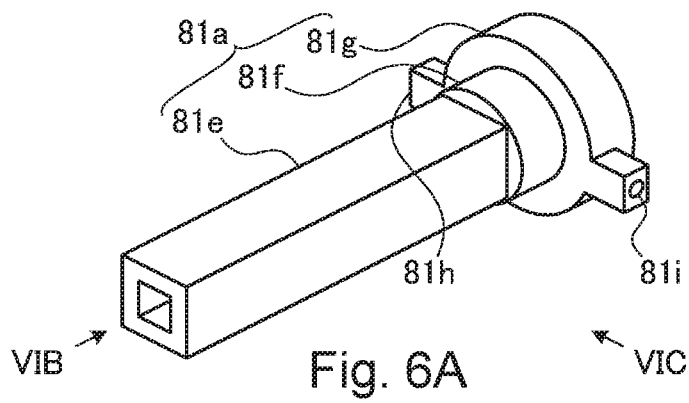
FIG. 6A is a perspective view of a shroud in a third embodiment of the present disclosure.
Figure 6B:
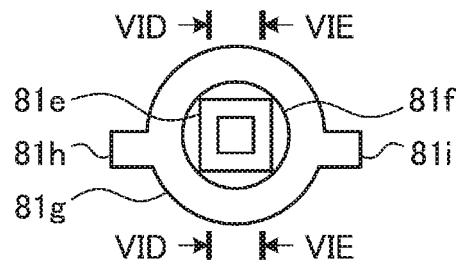
FIG. 6B is a front view of the shroud in FIG. 6A when viewed in the direction of Arrow VIB.
Figure 6C:
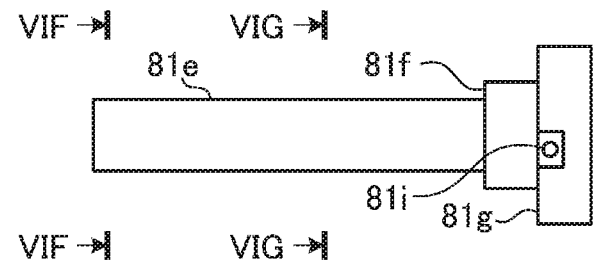
FIG. 6C is a side view of the shroud in FIG. 6A when viewed in the direction of Arrow VIC.

FIG. 6A is a perspective view of a shroud 81a in a third embodiment of the present disclosure. FIG. 6B is a front view of the shroud 81a in FIG. 6A when viewed in the direction of Arrow VIB. FIG. 6C is a side view of the shroud 81a in FIG. 6A when viewed in the direction of Arrow VIC. The direction of Arrow VIB is substantially aligned with the negative Y direction. The direction of Arrow VIC is substantially aligned with the negative Z direction.

Figure 6D:
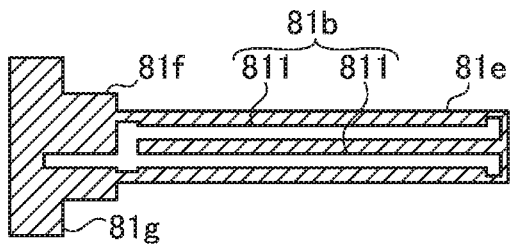
FIG. 6D is a cross-sectional view taken along line VID-VID in FIG. 6B.
Figure 6E:
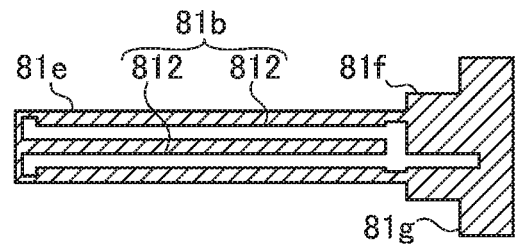
FIG. 6E is a cross-sectional view taken along line VIE-VIE in FIG. 6B.
Figure 6F:
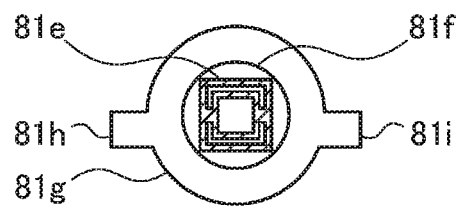
FIG. 6F is a cross-sectional view taken along line VIF-VIF in FIG. 6C.
Figure 6G:
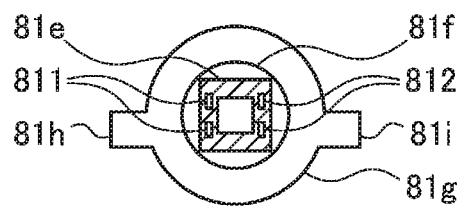
FIG. 6G is a cross-sectional view taken along line VIG-VIG in FIG. 6C.

FIG. 6D is a cross-sectional view taken along line VID-VID in FIG. 6B. FIG. 6E is a cross-sectional view taken along line VIE-VIE in FIG. 6B. FIG. 6F is a cross-sectional view taken along line VIF-VIF in FIG. 6C. FIG. 6G is a cross-sectional view taken along line VIG-VIG in FIG. 6C.

The shroud 81a is a tubular member penetrating in the direction of Arrow VIB. The shroud 81a includes a body part 81e, a connection part 81f, and a flange part 81g. As illustrated in FIGS. 6F and 6G, a cross-section of the body part 81e orthogonal to the trajectory of the target 27 has a rectangular shape. The connection part 81f is positioned between the body part 81e and the flange part 81g. The flange part 81g has an outer diameter larger than those of the body part 81e and the connection part 81f. The flange part 81g is connected with a shroud cooling medium entrance 81h and a shroud cooling medium exit 81i.

The flow path 81b of the shroud cooling medium includes a first part 811 positioned close to the EUV light condensing mirror 23a, and a second part 812 positioned farther from the EUV light condensing mirror 23a than the first part 811. In other words, the first part 811 is positioned on the negative Z direction side, and the second part 812 is positioned on the positive Z direction side. The first part 811 is positioned upstream of the second part 812 on the flow path.

As for the other features, the configuration of the third embodiment is same as the configuration of the first or second embodiment.

5.2 Operation and Effect

The shroud cooling medium flows from the shroud cooling medium entrance 81h close to the target generation unit 26a to a leading end part of the body part 81e, which is far from the target generation unit 26a, through the first part 811. The shroud cooling medium flows from the first part 811 to the second part 812 at the leading end part of the body part 81e illustrated in FIG. 6F. The shroud cooling medium flows from the leading end part of the body part 81e, which is far from the target generation unit 26a, to the shroud cooling medium exit 81i close to the target generation unit 26a through the second part 812.

The third embodiment achieves effects same as those of the first and second embodiments described above, and additionally achieves effects as follows.

The temperature of the shroud cooling medium supplied to the first part 811 can be made lower than the temperature of the shroud cooling medium supplied to the second part 812. Thus, tin can be prevented from accumulating on part of the shroud 81a on the negative Z direction side, which is close to the EUV light condensing mirror 23a, and from falling on the EUV light condensing mirror 23a.

Since the shroud 81a is fixed to the heat shield 7a, the relative positional relation between the shroud 81a and the trajectory of the target 27 changes as the target generation unit 26a is moved by the stage 36 and the trajectory of the target 27 is changed. When the movable range of the stage 36 is a rectangular range defined by a constant width in the X direction and a constant width in the Z direction, a correspondence relation can be provided between the movable range of the stage 36 and the sectional shape of the shroud 81a.

6. Shroud Having One Side Opened

6.1 Configuration

Figure 7A:
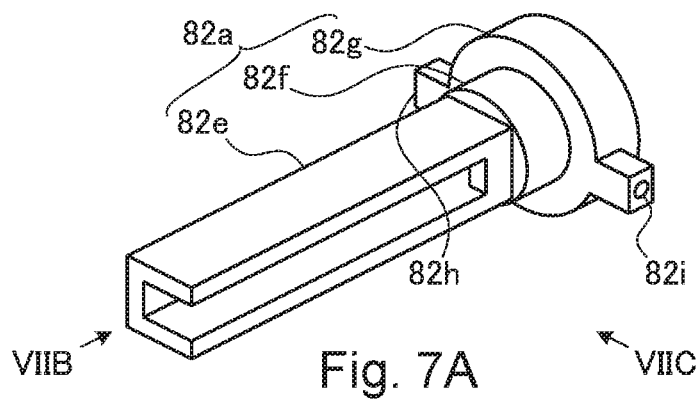
FIG. 7A is a perspective view of a shroud in a fourth embodiment of the present disclosure.
Figure 7B:
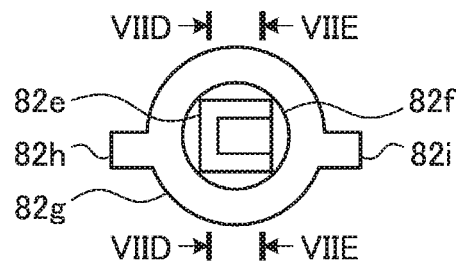
FIG. 7B is a front view of the shroud in FIG. 7A when viewed in the direction of Arrow VIIB.
Figure 7C:
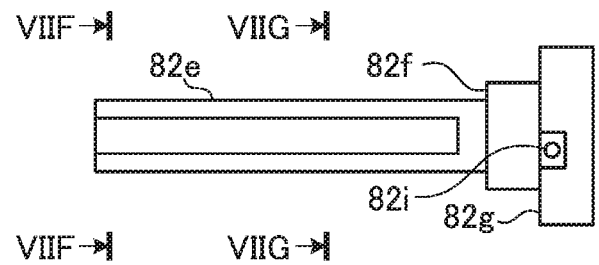
FIG. 7C is a side view of the shroud in FIG. 7A when viewed in the direction of Arrow VIIC.

FIG. 7A is a perspective view of a shroud 82a in a fourth embodiment of the present disclosure. FIG. 7B is a front view of the shroud 82a in FIG. 7A when viewed in the direction of Arrow VIIB. FIG. 7C is a side view of the shroud 82a in FIG. 7A when viewed in the direction of Arrow VIIC. The direction of Arrow VIIB is substantially aligned with the negative Y direction. The direction of Arrow VIIC is substantially aligned with the negative Z direction.

Figure 7D:
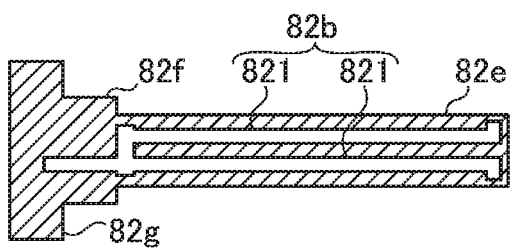
FIG. 7D is a cross-sectional view taken along line VIID-VIID in FIG. 7B.
Figure 7E:
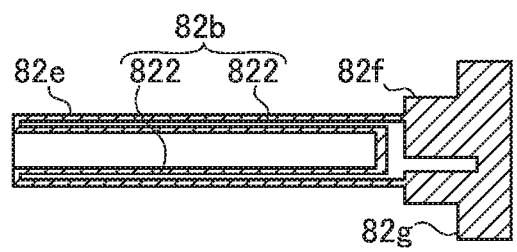
FIG. 7E is a cross-sectional view taken along line VIIE-VIIE in FIG. 7B.
Figure 7F:
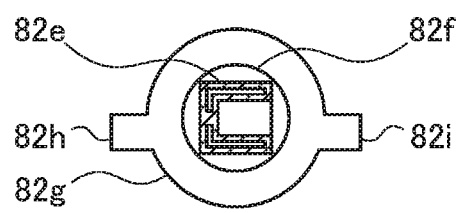
FIG. 7F is a cross-sectional view taken along line VIIF-VIIF in FIG. 7C.
Figure 7G:
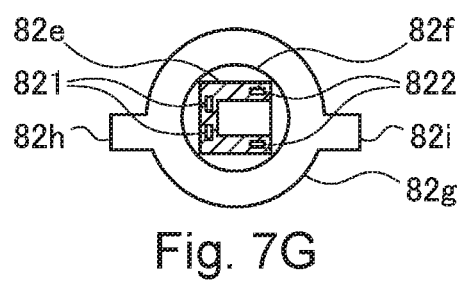
FIG. 7G is a cross-sectional view taken along line VIIG-VIIG in FIG. 7C.

FIG. 7D is a cross-sectional view taken along line VIID-VIID in FIG. 7B. FIG. 7E is a cross-sectional view taken along line VIIE-VIIE in FIG. 7B. FIG. 7F is a cross-sectional view taken along line VIIF-VIIF in FIG. 7C. FIG. 7G is a cross-sectional view taken along line VIIG-VIIG in FIG. 7C.

The shroud 82a includes a body part 82e, a connection unit 82f, and a flange part 82g. As illustrated in FIGS. 7F and 7G, a cross-section of the body part 82e orthogonal to the trajectory of the target 27 has a rectangular shape from which one of four sides is removed. This one side is one side on a side opposite to the EUV light condensing mirror 23a, in other words, on the positive Z direction side. The connection unit 82f is positioned between the body part 82e and the flange part 82g. The flange part 82g has an outer diameter larger than those of the body part 82e and the connection unit 82f. The flange part 82g is connected with a shroud cooling medium entrance 82h and a shroud cooling medium exit 82i.

The flow path 82b of the shroud cooling medium includes a first part 821 positioned close to the EUV light condensing mirror 23a, and a second part 822 positioned farther from the EUV light condensing mirror 23a than the first part 821. The first part 821 is positioned upstream of the second part 822 on the flow path.

As for the other features, the configuration of the fourth embodiment is same as the configuration of the first or second embodiment.

6.2 Operation and Effect

The shroud cooling medium flows from the shroud cooling medium entrance 82h close to the target generation unit 26a to a leading end part of the body part 82e, which is far from the target generation unit 26a, through the first part 821. The shroud cooling medium flows from the first part 821 to the second part 822 at the leading end part of the body part 82e illustrated in FIG. 7F. The shroud cooling medium flows from the leading end part of the body part 82e, which is far from the target generation unit 26a, to the shroud cooling medium exit 82i close to the target generation unit 26a through the second part 822.

The fourth embodiment achieves effects same as those of the first to third embodiments described above, and additionally achieves effects as follows.

Since a cross-section of the shroud 82a orthogonal to the trajectory of the target 27 has a rectangular shape from which one of four sides is removed, the target 27 passing inside the shroud 82a can be optically detected by the target sensor 4 positioned outside the shroud 82a.

The hydrogen gas output from the gas nozzle 52 and the stannane gas generated through reaction between the hydrogen radical and tin flow in the positive Z direction in some cases. Since the shroud 82a is opened on the positive Z direction side opposite to the EUV light condensing mirror 23a and covers the trajectory of the target 27 on the negative Z direction side, the position of the target 27 is prevented from deviating from an ideal trajectory due to gas flow.

6.3 Configuration of Modification

Figure 8A:
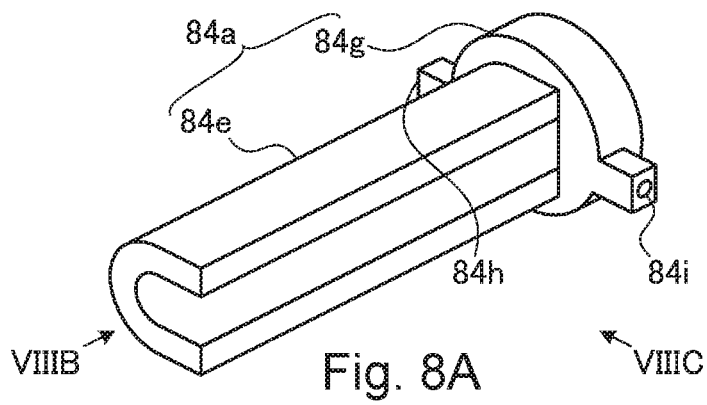
FIG. 8A is a perspective view of a shroud in a modification of the fourth embodiment.
Figure 8B:
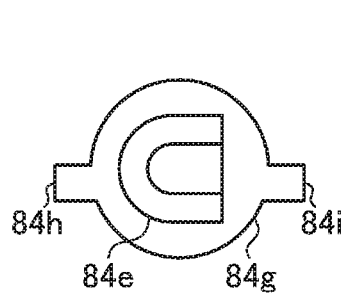
FIG. 8B is a front view of the shroud in FIG. 8A when viewed in the direction of Arrow VIIIB.
Figure 8C:
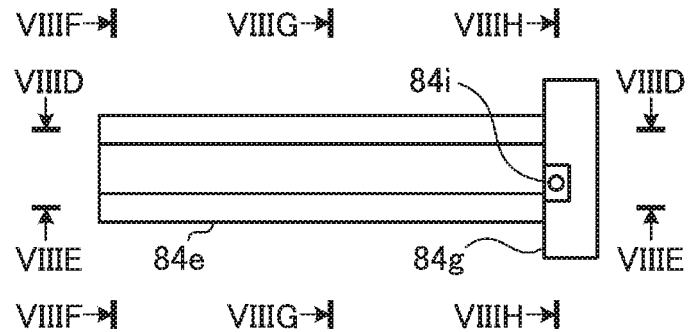
FIG. 8C is a side view of the shroud in FIG. 8A when viewed in the direction of Arrow VIIIC.

FIG. 8A is a perspective view of a shroud 84a in a modification of the fourth embodiment. FIG. 8B is a front view of the shroud 84a in FIG. 8A when viewed in the direction of Arrow VIIIB. FIG. 8C is a side view of the shroud 84a in FIG. 8A when viewed in the direction of Arrow VIIIC. The direction of Arrow VIIIB is substantially aligned with the negative Y direction. The direction of Arrow VIIIC is substantially aligned with the negative Z direction.

Figure 8D:
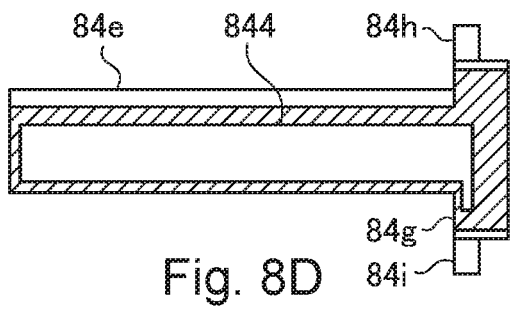
FIG. 8D is a cross-sectional view taken along line VIIID-VIIID in FIG. 8C.
Figure 8E:
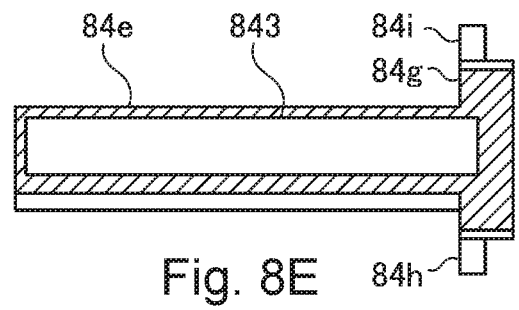
FIG. 8E is a cross-sectional view taken along line VIIIE-VIIIE in FIG. 8C.
Figure 8F:
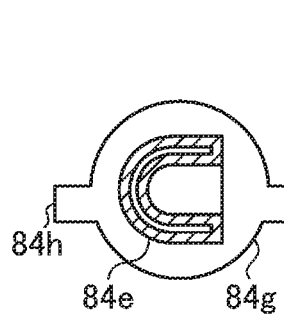
FIG. 8F is a cross-sectional view taken along line VIIIF-VIIIF in FIG. 8C.
Figure 8G:
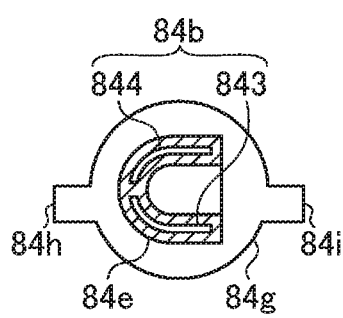
FIG. 8G is a cross-sectional view taken along line VIIIG-VIIIG in FIG. 8C.
Figure 8H:
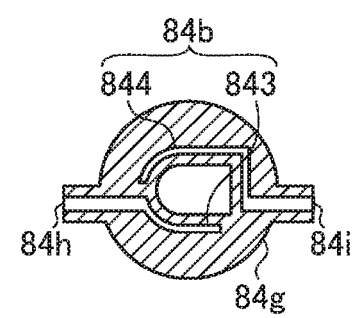
FIG. 8H is a cross-sectional view taken along line VIIIH-VIIIH in FIG. 8C.

FIG. 8D is a cross-sectional view taken along line VIIID-VIIID in FIG. 8C. FIG. 8E is a cross-sectional view taken along line VIIIE-VIIIE in FIG. 8C. FIG. 8F is a cross-sectional view taken along line VIIIF-VIIIF in FIG. 8C. FIG. 8G is a cross-sectional view taken along line VIIIG-VIIIG in FIG. 8C. FIG. 8H is a cross-sectional view taken along line VIIIH-VIIIH in FIG. 8C.

The shroud 84a includes a body part 84e and a flange part 84g. As illustrated in FIGS. 8F and 8G, a cross-section of the body part 84e orthogonal to the trajectory of the target 27 has a U-shape. The cross-section in a U-shape is opened toward a side opposite to the EUV light condensing mirror, in other words, the positive Z direction side. The flange part 84g has an outer diameter larger than that of the body part 84e. The flange part 84g is connected with a shroud cooling medium entrance 84h and a shroud cooling medium exit 84i.

The flow path 84b of the shroud cooling medium includes a first part 843 and a second part 844. The first part 843 is positioned upstream of the second part 844 on the flow path. In the present modification, the distance from the EUV light condensing mirror 23a may be substantially same between the first part 843 and the second part 844.

As for the other features, the configuration of the modification is same as the configuration of the fourth embodiment.

6.4 Operation and Effect of Modification

The shroud cooling medium flows from the shroud cooling medium entrance 84h close to the target generation unit 26a to a leading end part of the body part 84e, which is far from the target generation unit 26a, through the first part 843. The shroud cooling medium flows from the first part 843 to the second part 844 at the leading end part of the body part 84e illustrated in FIG. 8F. The shroud cooling medium flows from the leading end part of the body part 84e, which is far from the target generation unit 26a, to the shroud cooling medium exit 84i close to the target generation unit 26a through the second part 844.

The modification achieves effects same as those of the fourth embodiment, and additionally achieves effects as follows.

Since a cross-section of the shroud 84a orthogonal to the trajectory of the target 27 has a U-shape so that a side close to the EUV light condensing mirror 23a is configured as a semi-cylindrical curved surface, gas flow turbulence can be prevented from occurring around the shroud 84a, and tin and stannane floating inside the chamber 2a can be efficiently ejected.

7. Shroud Having Cylindrical Shape 7.1 Configuration

Figure 9A:
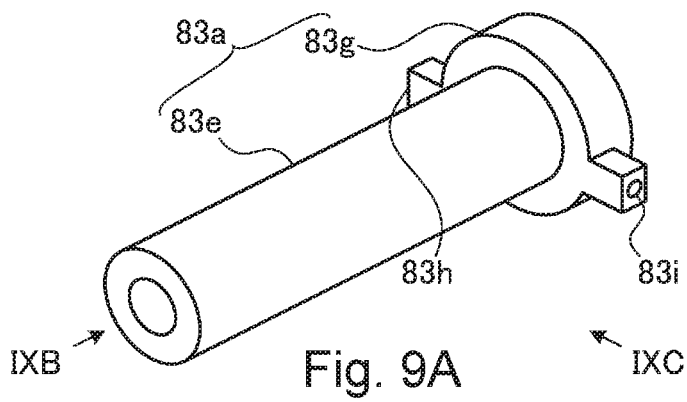
FIG. 9A is a perspective view of a shroud in a fifth embodiment of the present disclosure.
Figure 9B:
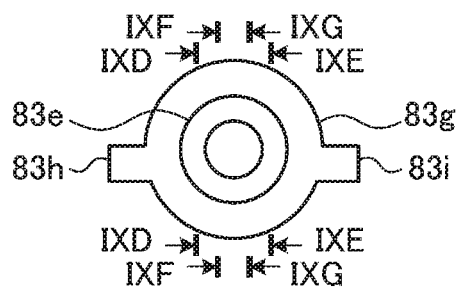
FIG. 9B is a front view of the shroud in FIG. 9A when viewed in the direction of Arrow IXB.
Figure 9C:
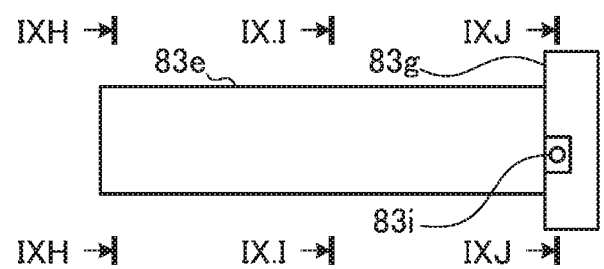
FIG. 9C is a side view of the shroud in FIG. 9A when viewed in the direction of Arrow IXC.

FIG. 9A is a perspective view of a shroud 83a in a fifth embodiment of the present disclosure. FIG. 9B is a front view of the shroud 83a in FIG. 9A when viewed in the direction of Arrow IXB. FIG. 9C is a side view of the shroud 83a in FIG. 9A when viewed in the direction of Arrow IXC. The direction of Arrow IXB is substantially aligned with the negative Y direction. The direction of Arrow IXC is substantially aligned with the negative Z direction.

Figure 9D:
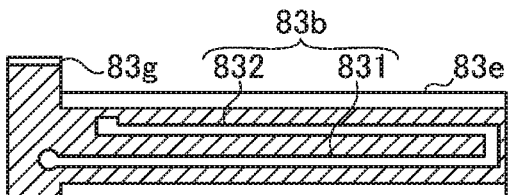
FIG. 9D is a cross-sectional view taken along line IXD-IXD in FIG. 9B.
Figure 9E:
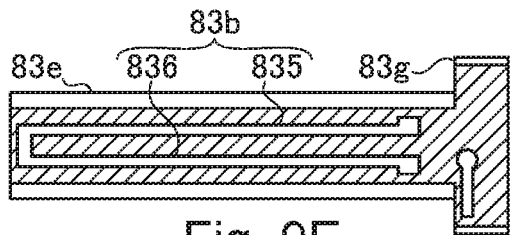
FIG. 9E is a cross-sectional view taken along line IXE-IXE in FIG. 9B.
Figure 9F:
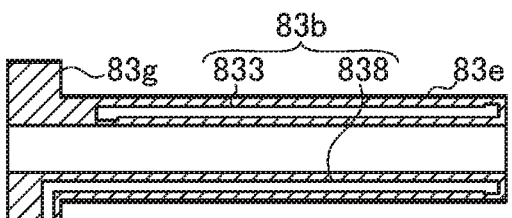
FIG. 9F is a cross-sectional view taken along line IXF-IXF in FIG. 9B.
Figure 9G:
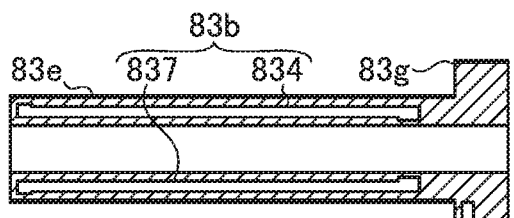
FIG. 9G is a cross-sectional view taken along line IXG-IXG in FIG. 9B.

FIG. 9D is a cross-sectional view taken along line IXD-IXD in FIG. 9B. FIG. 9E is a cross-sectional view taken along line IXE-IXE in FIG. 9B. FIG. 9F is a cross-sectional view taken along line IXF-IXF in FIG. 9B. FIG. 9G is a cross-sectional view taken along line IXG-IXG in FIG. 9B.

Figure 9H:
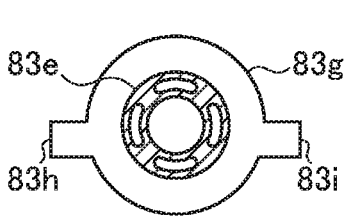
FIG. 9H is a cross-sectional view taken along line IXH-IXH in FIG. 9C.
Figure 9I:
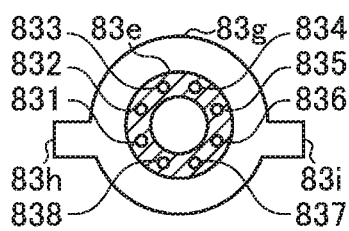
FIG. 9I is a cross-sectional view taken along line IX.I-IX.I illustrated in FIG. 9C.
Figure 9J:
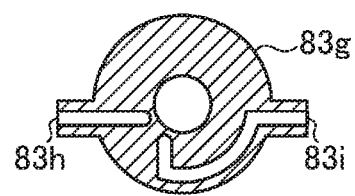
FIG. 9J is a cross-sectional view taken along line IXJ-IXJ in FIG. 9C.

FIG. 9H is a cross-sectional view taken along line IXH-IXH in FIG. 9C. FIG. 9I is a cross-sectional view taken along line IX.I-IX.I in FIG. 9C. FIG. 9J is a cross-sectional view taken along line IXJ-IXJ in FIG. 9C.

The shroud 83a is a tubular member penetrating in the direction of Arrow IXB. The shroud 83a includes a body part 83e and a flange part 83g. As illustrated in FIGS. 9H and 9I, a cross-section of the body part 83e orthogonal to the trajectory of the target 27 has a circular shape. The flange part 83g has an outer diameter larger than that of the body part 83e. The flange part 83g is connected with a shroud cooling medium entrance 83h and a shroud cooling medium exit 83i.

The flow path 83b of the shroud cooling medium includes a first part 831 and a second part 832 that are positioned close to the EUV light condensing mirror 23a, and a third part 833 to an eighth part 838 that are positioned farther from the EUV light condensing mirror 23a than the first part 831 and the second part 832. The first part 831 and the second part 832 are positioned upstream of the third part 833 to the eighth part 838 on the flow path.

As for the other features, the configuration of the fifth embodiment is same as the configuration of the first or second embodiment.

7.2 Operation and Effect

The shroud cooling medium flows from the shroud cooling medium entrance 83h close to the target generation unit 26a to a leading end part of the body part 83e, which is far from the target generation unit 26a, through the first part 831. The shroud cooling medium flows from the first part 831 to the second part 832 at the leading end part of the body part 83e illustrated in FIG. 9H. The shroud cooling medium flows from the leading end part of the body part 83e, which is far from the target generation unit 26a, to a base end part of the body part 83e, which is close to the target generation unit 26a through the second part 832.

Thereafter, the shroud cooling medium flows through the third part 833, the fourth part 834, the fifth part 835, the sixth part 836, the seventh part 837, and the eighth part 838 in the stated order through reciprocation between the base and leading end parts of the body part 83e. The shroud cooling medium flows from the eighth part 838 to the shroud cooling medium exit 83i through the inside of the flange part 83g.

The fifth embodiment achieves effects same as those of the first to third embodiments described above, and additionally achieves effects as follows.

Since a cross-section of the shroud 83a orthogonal to the trajectory of the target 27 has a circular shape, gas flow turbulence can be prevented from occurring around the shroud 83a, and tin and stannane floating inside the chamber 2a can be efficiently ejected.

8. Other

Figure 10:
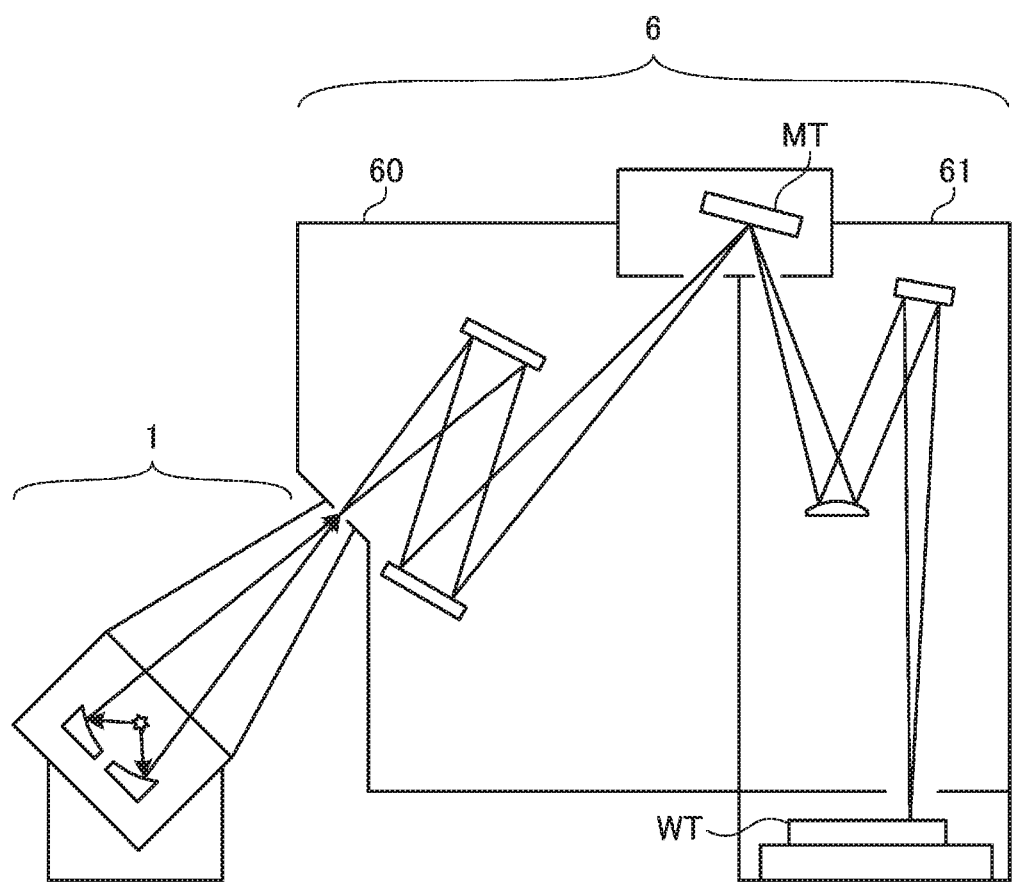
FIG. 10 schematically illustrates the configuration of an exposure apparatus connected with an EUV light generation apparatus.

FIG. 10 schematically illustrates the configuration of the exposure apparatus 6 connected with the EUV light generation apparatus 1.

In FIG. 10, the exposure apparatus 6 includes a mask irradiation unit 60 and a workpiece irradiation unit 61. The mask irradiation unit 60 illuminates, with EUV light incident from the EUV light generation apparatus 1, a mask pattern on a mask table MT through a reflection optical system. The workpiece irradiation unit 61 images the EUV light reflected by the mask table MT onto a workpiece (not illustrated) disposed on a workpiece table WT through the reflection optical system. The workpiece is a photosensitive substrate such as a semiconductor wafer to which a photoresist is applied. The exposure apparatus 6 translates the mask table MT and the workpiece table WT in synchronization with each other to expose the workpiece to the EUV light reflected by the mask pattern. Through an exposure process as described above, a device pattern is transferred onto the semiconductor wafer to manufacture an electronic device.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms unless stated obviously. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An EUV chamber apparatus comprising:
   a chamber;
   a target generation unit configured to output a target toward a predetermined region inside the chamber;
   a gas nozzle through which gas is supplied into the chamber;
   an EUV light condensing mirror disposed inside the chamber; and
   a shroud including a first flow path through which a first cooling medium circulates and surrounding at least part of a trajectory of the target inside the chamber;
   wherein the first flow path includes a first part positioned close to the EUV light condensing mirror and a second part positioned farther from the EUV light condensing mirror than the first part, the first part being positioned upstream of the second part.

2. The EUV chamber apparatus according to claim 1, wherein the gas contains hydrogen gas.

3. The EUV chamber apparatus according to claim 1, further comprising a heat shield disposed between the predetermined region and the chamber inside the chamber, wherein the shroud is fixed to the heat shield.

4. The EUV chamber apparatus according to claim 3, wherein the heat shield includes a through-hole through which the shroud penetrates, part of the shroud is positioned outside the heat shield and fixed to an outer surface of the heat shield, and another part of the shroud is positioned inside the heat shield.

5. The EUV chamber apparatus according to claim 1, wherein the shroud is maintained at a temperature lower than 40° C.

6. The EUV chamber apparatus according to claim 1, wherein the shroud is maintained at a temperature lower than 5° C.

7. The EUV chamber apparatus according to claim 1, further comprising:
   a first temperature adjustment device configured to adjust a temperature of the first cooling medium; and
   a control unit configured to control the first temperature adjustment device,
   wherein the control unit controls the first temperature adjustment device so that a temperature of the shroud becomes lower than a temperature of the chamber.

8. The EUV chamber apparatus according to claim 1, wherein the chamber includes a second flow path through which a second cooling medium circulates, the EUV chamber apparatus further comprising:
- a first temperature adjustment device configured to adjust a temperature of the first cooling medium; and
- a control unit configured to control the first temperature adjustment device so that the temperature of the first cooling medium supplied to the first flow path becomes lower than a temperature of the second cooling medium supplied to the second flow path.

9. The EUV chamber apparatus according to claim 1, further comprising:
- a first temperature adjustment device configured to adjust a temperature of the first cooling medium;
- a second temperature adjustment device configured to adjust a temperature of the third cooling medium; and
- a control unit configured to control the first and second temperature adjustment devices,
- wherein the EUV light condensing mirror includes a third flow path through which a third cooling medium circulates, and
- the control unit controls the first and second temperature adjustment devices so that a temperature of the shroud and a temperature of the EUV light condensing mirror become lower than a temperature of the chamber.

10. The EUV chamber apparatus according to claim 1, wherein the chamber includes a second flow path through which a second cooling medium circulates, the EUV chamber apparatus further comprising:
- a first temperature adjustment device configured to adjust a temperature of the first cooling medium;
- a second temperature adjustment device configured to adjust a temperature of the third cooling medium; and
- a control unit configured to control the first and second temperature adjustment devices so that a temperature of the first cooling medium supplied to the first flow path and a temperature of the third cooling medium supplied to the third flow path become lower than a temperature of the second cooling medium supplied to the second flow path,
- wherein the EUV light condensing mirror includes a third flow path through which a third cooling medium circulates.

11. The EUV chamber apparatus according to claim 1, further comprising:
- a first temperature adjustment device configured to adjust a temperature of the first cooling medium;
- a heat shield including a fourth flow path through which a fourth cooling medium circulates and disposed between the predetermined region and the chamber inside the chamber;
- a third temperature adjustment device configured to adjust a temperature of the fourth cooling medium; and
- a control unit configured to control the first and third temperature adjustment devices,
- wherein the control unit controls the first and third temperature adjustment devices so that a temperature of the shroud and a temperature of the heat shield become lower than a temperature of the chamber.

12. The EUV chamber apparatus according to claim 1, wherein the chamber includes a second flow path through which a second cooling medium circulates, the EUV chamber apparatus further comprising:
- a first temperature adjustment device configured to adjust a temperature of the first cooling medium;
- a heat shield including a fourth flow path through which a fourth cooling medium circulates and disposed between the predetermined region and the chamber inside the chamber;
- a third temperature adjustment device configured to adjust a temperature of the fourth cooling medium; and
- a control unit configured to control the first and third temperature adjustment devices so that the temperature of the first cooling medium supplied to the first flow path and the temperature of the fourth cooling medium supplied to the fourth flow path become lower than a temperature of the second cooling medium supplied to the second flow path.

13. The EUV chamber apparatus according to claim 1, wherein a cross-section of the shroud orthogonal to the trajectory of the target has a rectangular shape.

14. The EUV chamber apparatus according to claim 1, wherein a cross-section of the shroud orthogonal to the trajectory of the target has a rectangular shape from which one of four sides is removed, the one side being a side opposite to the EUV light condensing mirror.

15. The EUV chamber apparatus according to claim 1, wherein
- a cross-section of the shroud orthogonal to the trajectory of the target has a U-shape, and
 - the cross-section in a U-shape is opened toward a side opposite to the EUV light condensing mirror.

16. The EUV chamber apparatus according to claim 1, wherein a cross-section of the shroud orthogonal to the trajectory of the target has a circular shape.

17. An electronic device manufacturing method comprising, in an extreme ultraviolet light generation system including
- a chamber,
- a target generation unit configured to output a target toward a predetermined region inside the chamber,
- a laser apparatus configured to irradiate the target with a pulse laser beam to generate plasma from the target,
- an EUV light condensing mirror disposed inside the chamber,
- a gas nozzle through which gas is supplied into the chamber, and
- a shroud including a first flow path through which a first cooling medium circulates and surrounding at least part of a trajectory of the target inside the chamber, wherein the first flow path includes a first part positioned close to the EUV light condensing mirror and a second part positioned farther from the EUV light condensing mirror than the first part, the first part being positioned upstream of the second part:
- irradiating the target with the pulse laser beam to generate extreme ultraviolet light;
- outputting the extreme ultraviolet light to an exposure apparatus; and
- exposing a photosensitive substrate to the extreme ultraviolet light in the exposure apparatus to manufacture an electronic device.

18. An EUV chamber apparatus comprising:
- a chamber;
- a target generation unit configured to output a target toward a predetermined region inside the chamber;
- a gas nozzle through which gas is supplied into the chamber;
- a shroud including a first flow path through which a first cooling medium circulates and surrounding at least part of a trajectory of the target inside the chamber; a temperature sensor configured to measure a temperature of the shroud;

a first temperature adjustment device configured to adjust a temperature of the first cooling medium; and a control unit configured to control the first temperature adjustment device based on an output from the temperature sensor.

19. An extreme ultraviolet light generation system comprising:

a chamber;

a target generation unit configured to output a target toward a predetermined region inside the chamber;

a laser apparatus configured to irradiate the target with a pulse laser beam to generate plasma from the target;

an EUV light condensing mirror disposed inside the chamber;

a gas nozzle through which gas is supplied into the chamber; and a shroud including a first flow path through which a first cooling medium circulates and surrounding at least part of a trajectory of the target inside the chamber, wherein the first flow path includes a first part positioned close to the EUV light condensing mirror and a second part positioned farther from the EUV light condensing mirror than the first part, the first part being positioned upstream of the second part.

* * * * *